US012696589B2

(12) United States Patent
Chien

(10) Patent No.: US 12,696,589 B2
(45) Date of Patent: Jul. 28, 2026

(54) LIGHT-EMITTING DEVICE AND DISPLAY DEVICE USING THE SAME

(71) Applicant: EPISTAR CORPORATION, Hsinchu (TW)

(72) Inventor: Jan-Way Chien, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 645 days.

(21) Appl. No.: 18/087,729

(22) Filed: Dec. 22, 2022

(65) Prior Publication Data

US 2023/0215981 A1     Jul. 6, 2023

(30) Foreign Application Priority Data

Jan. 5, 2022     (TW) .................................. 111100409

(51) Int. Cl.
　*H10H 20/831*　　　(2025.01)
　*H10H 20/814*　　　(2025.01)
　*H10H 20/857*　　　(2025.01)

(52) U.S. Cl.
　CPC ...... *H10H 20/8312* (2025.01); *H10H 20/814* (2025.01); *H10H 20/857* (2025.01)

(58) Field of Classification Search
None
See application file for complete search history.

(56) References Cited

U.S. PATENT DOCUMENTS

| | | | | | |
|---|---|---|---|---|---|
| 2005/0253156 A1* | 11/2005 | Horio | ................... | H10H 20/813 |
| | | | | | 257/94 |
| 2015/0084084 A1* | 3/2015 | Chae | ................... | H10H 20/841 |
| | | | | | 257/98 |
| 2017/0012176 A1* | 1/2017 | Chae | ................... | H10H 20/819 |
| 2020/0403117 A1* | 12/2020 | Fabien | ............... | H01L 25/0753 |

* cited by examiner

*Primary Examiner* — Khaja Ahmad
(74) *Attorney, Agent, or Firm* — Patterson + Sheridan, LLP

(57) ABSTRACT

A light-emitting device includes a semiconductor stack, a first electrode, a first electrode pad, and second electrode pads. The semiconductor stack includes a first semiconductor layer, a first mesa formed on the first semiconductor layer, and second mesas spaced apart from each other and formed on the first semiconductor layer and separated from the first mesa. The first mesa and the second mesas respectively include a second semiconductor layer on having a second conductivity type different from a first conductivity type of the semiconductor stack. The first electrode covers and contacts the first mesa and is electrically connected to the first semiconductor layer. The first electrode pad is formed on the first mesa and is connected to the first electrode layer. The second electrode pads are formed on the second mesas, and are electrically connected to the second semiconductor layer of each of the second mesas.

19 Claims, 9 Drawing Sheets

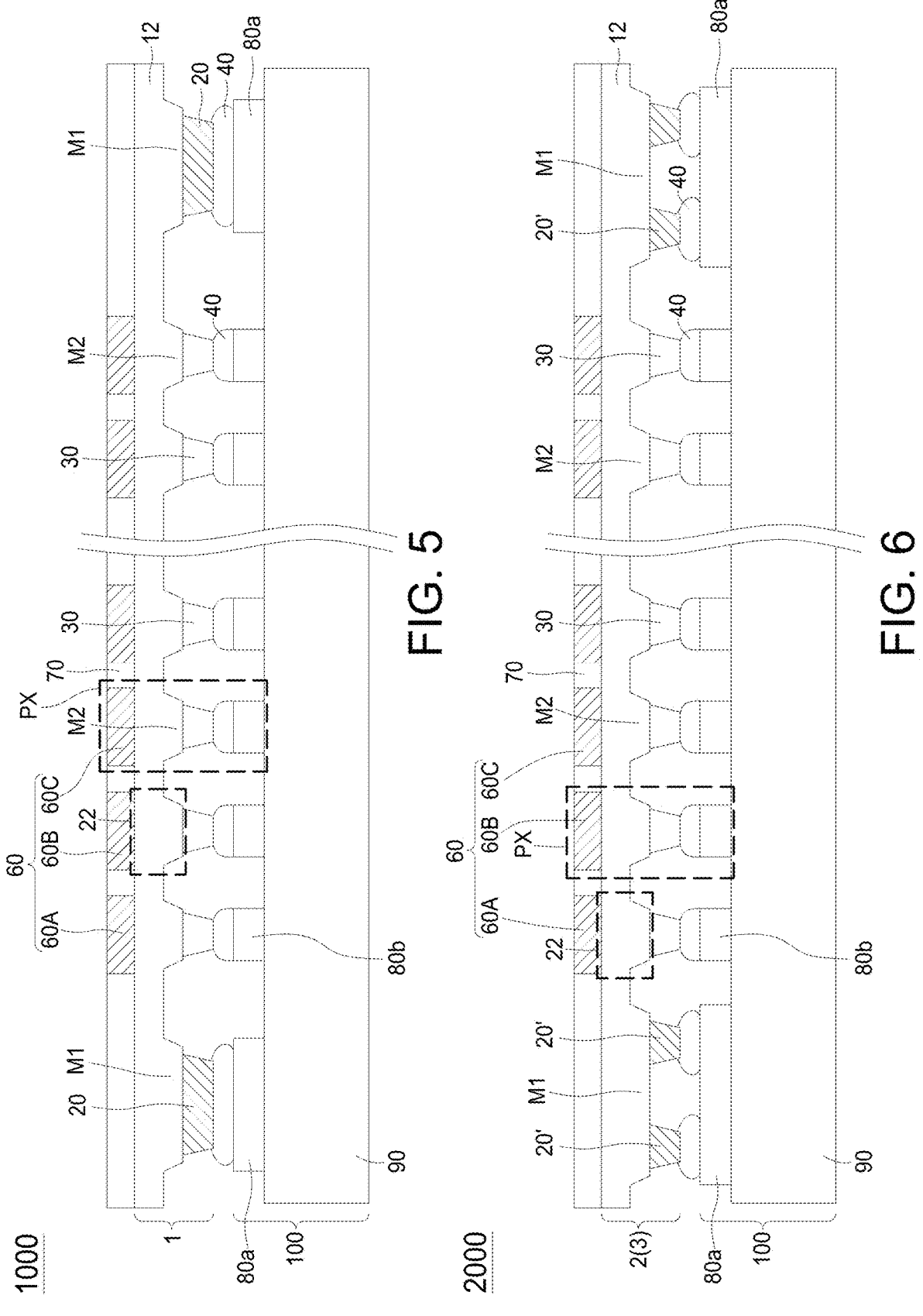

LIGHT-EMITTING DEVICE AND DISPLAY DEVICE USING THE SAME

CROSS-REFERENCE TO RELATED APPLICATIONS

This application claims priority to the benefit of Taiwan Patent Application No. 111100409 filed on Jan. 5, 2022, and the entire contents of which are hereby incorporated by reference herein in its entirety.

BACKGROUND

The present application relates to a light-emitting device and a display device having the same, more specifically, to a light-emitting device having light-emitting units arranged in an array and a display device having the same.

DESCRIPTION OF THE RELATED ART

The light-emitting diode devices of solid-state lighting device have the characteristics of low power consumption, high brightness, high color rendering and compact size. Thus, the light-emitting diode devices have been widely used in lighting and display device. For example, the display device with the light-emitting diodes as the pixels can replace conventional liquid crystal display device and achieve an improved image quality. While the light-emitting device is applied to display device, how to keep the photo-electric characteristics thereof and improve the display quality of the display device concerns people in the present technology field.

SUMMARY

A light-emitting device, includes: a semiconductor stack, wherein semiconductor stack includes: a first semiconductor layer, having a first conductivity type; a first mesa, formed on the first semiconductor layer; and a plurality of second mesas, spaced apart from each other and formed on the first semiconductor layer and separated from the first mesa; wherein the first mesa and the plurality of second mesas respectively include a second semiconductor layer on the first semiconductor layer, and the second semiconductor layers have a second conductivity type different from the first conductivity type; a first electrode, covering and contacting the first mesa and electrically connected to the first semiconductor layer; a first electrode pad, formed on the first mesa and connected to the first electrode layer; and a plurality of second electrode pads, correspondingly formed on the plurality of second mesas, and each of the second electrode pads is electrically connected to the second semiconductor layer of each of the plurality of second mesas.

A display device, includes: a driving backplane, including a first driving electrode and a plurality of second driving electrodes; a light-emitting device, coupled to the driving backplane, wherein the light-emitting device includes: a first semiconductor layer; a first semiconductor mesa, formed on the first semiconductor layer; a plurality of second semiconductor mesas, spaced apart with each other and formed on the first semiconductor layer; a first electrode, covering and contacting the first semiconductor mesa and electrically connected to the first semiconductor layer; a first electrode pad, formed on the first semiconductor mesa and connected to the first electrode; and a plurality of second electrode pads, correspondingly formed on and electrically connected to the plurality of second semiconductor mesas; and a bonding layer, connecting the first electrode pad and the first driving electrode, and correspondingly connecting each of the plurality of second electrode pads and each of the plurality of second driving electrodes.

BRIEF DESCRIPTION OF THE DRAWINGS

FIG. 5 shows a display device 1000 including light-emitting devices in accordance with some embodiment of the present application.

FIG. 6 shows a display device 2000 including light-emitting devices in accordance with some embodiment of the present application.

DETAILED DESCRIPTION OF THE EMBODIMENTS

Figure 1A:
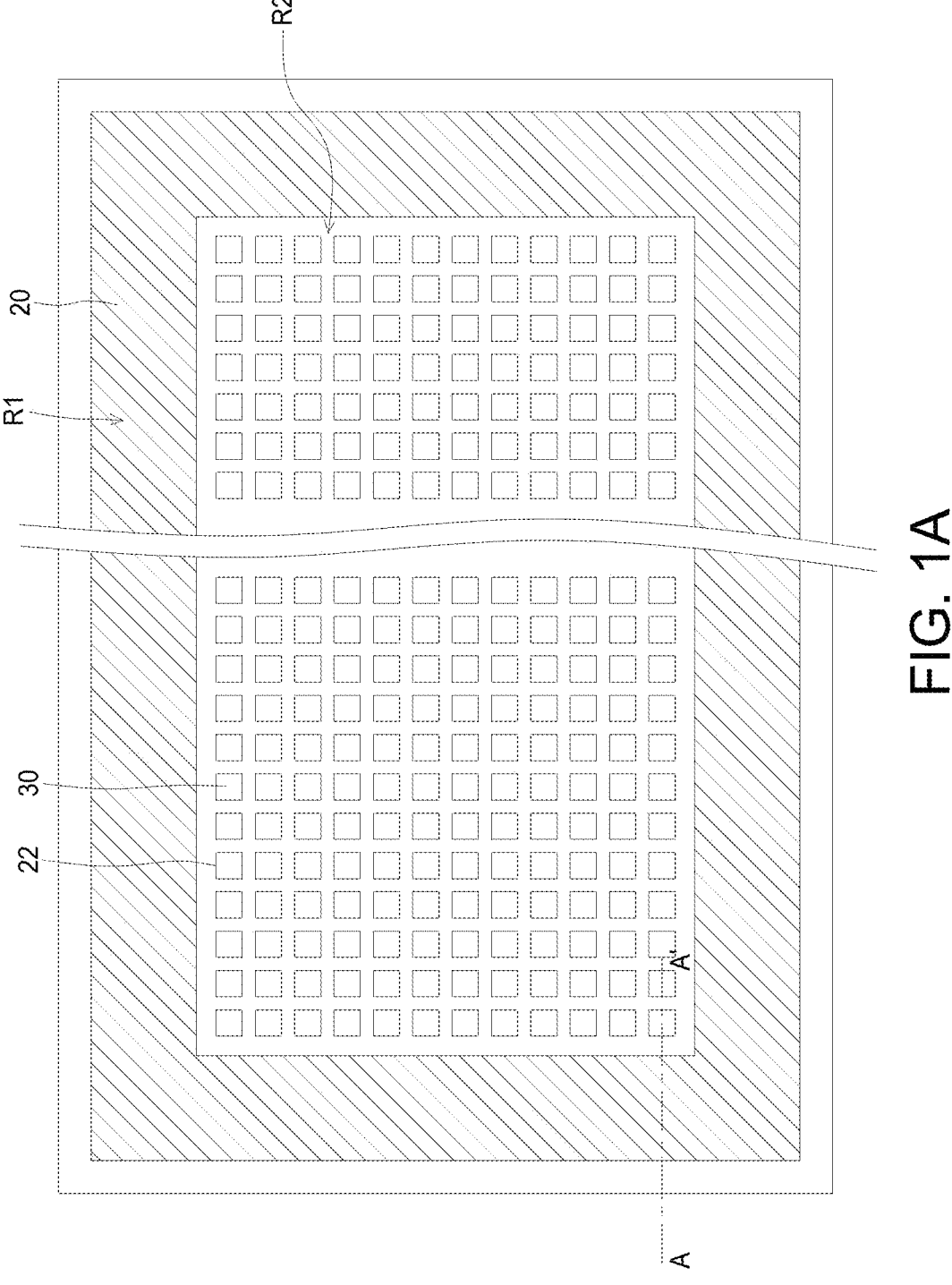
FIG. 1A shows a top view of a light-emitting device 1 in accordance with a first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. In addition, the dimensions, materials, shapes, arrangements, etc. of the components described in the embodiments are used to explain the disclosure, and the scope of the present disclosure is not limited thereto unless otherwise defined. The drawings are not precise scale and components may be exaggerated in view of size or location. Furthermore, some other layers, structures or steps can be incorporated in to the following embodiments. For example, the description "forming a second layer (structure) on a first layer (structure)" can be referred to embodiments with the first layer (structure) directly contacting the second layer (structure), or embodiments with the first layer (structure) indirectly contacting the second layer (structure). That is, there can be some other layer (structure) existing between the first layer (structure) and the second layer (structure). The spatial relationship between the first layer (structure) and the second layer (structure) can be modified depending on the operation or use of the device. The first layer (structure) is not limited to a single layer or a single structure. The first layer may include multiple sub-layers and the first structure may include multiple sub-structures. In the present application, the similar or identical reference numerals will denote the similar or identical components throughout the drawings. To better and concisely explain the disclosure, the same name or the same reference number given or appeared in different paragraphs or figures along the specification should has the same or equivalent meanings while it is once defined anywhere of the disclosure.

Figure 1B:
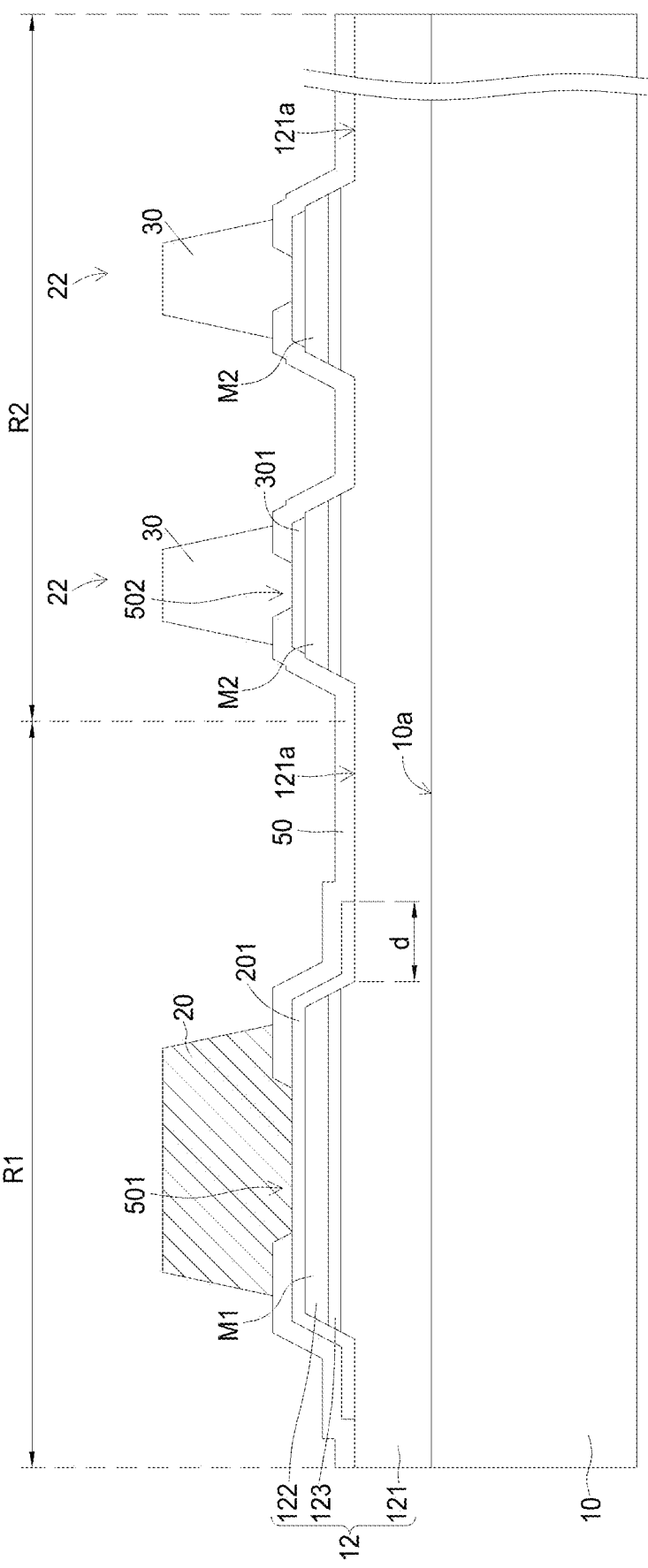
FIG. 1B shows a cross-sectional view taken along an AA' line in FIG. 1A.

FIG. 1A shows a top view of a light-emitting device 1 in accordance with a first embodiment of the present application. FIG. 1B shows a cross-sectional view taken along the AA' line in FIG. 1A. As shown in FIG. 1A, the light-emitting device 1 includes a first area R1 and a second area R2, while a plurality of light-emitting units 22 forms an array in the second area R2. In one embodiment, the light-emitting device 1 is applied to a display device. However, the application of light-emitting device in the present application is not limited to thereto. For example, the light-emitting device 1 can be used in backlight, lighting and other applications. The light-emitting unit 22 located in the second area R2 defines a sub-pixel of the display device, and a plurality of adjacent sub-pixels composes a pixel so that the second area R2 acts as a display area in the display device while the first area R1 corresponds to non-display area. In the following embodiments, the first area R1 and the second area R2 are represented by non-display area R1 and a display area R2, respectively. As shown in the top view of the light-emitting device 1, the non-display area R1 is disposed in a periphery of the light-emitting device 1 and surrounds the display area R2. However, the light-emitting device 1 of the present application is not limited thereto, and the non-display area R1 can be disposed on any side, any adjacent sides, any two opposite sides or any corner of the light-emitting device 1.

Referring to FIG. 1B, the light-emitting device 1 includes a semiconductor stack 12, wherein the semiconductor stack 12 includes a first semiconductor layer 121, an active region 123 and a second semiconductor layer 122 stacked in sequence on a top surface 10a of the substrate 10. The first semiconductor layer 121 includes a first part having a first surface 121a that is not covered by the active region 123 and the second semiconductor layer 122, and second parts on which the active region 123 and the second semiconductor layer 122 are formed. Each of the second part forms a semiconductor mesa. The semiconductor mesas include a first semiconductor mesa M1 located in the non-display area R1 and a plurality of second semiconductor mesas M2 arranged with intervals located in the display area R2. The second semiconductor mesa M2 and the first semiconductor layer 121 right below thereof constitute a light-emitting unit 22. In the present application, the semiconductor mesa can be simply named mesa. In one embodiment, the first mesa M1 and the second mesa M2 have the same height, wherein the same height means that the difference between the two heights is less than 10%. In one embodiment, an angle between the sidewall of the first mesa M1 and the first surface 121a and an angle between the second mesa M2 and the first surface 121a are respectively between 90 degrees and 120 degrees. In one embodiment, the angles are in a range between 90 degrees and 100 degrees. In another embodiment, the angle between the sidewall of the first mesa M1 and the first surface 121a is greater than the angle between the sidewall of the second mesa M2 and the first surface 121a. In the top view, the first mesa M1 is formed in the periphery area of the light-emitting device 1 and surrounds the plurality of second mesas M2. Each of the plurality of second mesas M2 has a shape, such as s circle, a polygon, or an irregular shape, and the shapes of the second mesas M2 can be the same or different. In the present embodiment, the shape of each second mesa M2 is a rectangle.

In one embodiment, the light-emitting device 1 includes a substrate 10 connecting the semiconductor stack 12. The substrate 10 can be a growth substrate for growing semiconductor layers thereon. The substrate 10 includes GaAs or GaP for growing AlGaInP based semiconductor thereon. The substrate 10 includes sapphire ($Al_2O_3$), GaN, SiC, MN or Si for growing AlGaInN based semiconductor such as GaN, InGaN or AlGaN thereon. The substrate 10 can be a patterned substrate; that is, the substrate 10 includes a plurality of patterned structures (not shown) on the top surface thereof. In one embodiment, the light generated from the semiconductor stack 12 is refracted by the patterned structures, thereby increasing the brightness of the light-emitting device. In addition, the patterned structures lessen or suppress the dislocations caused by lattice mismatch between the substrate 10 and the semiconductor stack 12, thereby improving the epitaxy quality of the semiconductor stack 12. In another embodiment, the substrate 10 can be separated and removed from the semiconductor stack 12 in a subsequent process so the light-emitting device 1 does not have the substrate 10.

In an embodiment of the present application, the semiconductor stack 12 is formed on the substrate 10 by metal-organic chemical vapor deposition (MOCVD), molecular beam epitaxy (MBE), hydride vapor epitaxy (HVPE) or ion plating such as sputtering or evaporating. The material of the semiconductor stack 12 includes III-V semiconductor with $Al_xIn_yGa_{(1-x-y)}N$ or $Al_xIn_yGa_{(1-x-y)}P$, where $0 \leq x$, $y \leq 1$; $x+y \leq 1$. In one embodiment, the first semiconductor layer 121 and the second semiconductor layer 122 are, for example, cladding layers or confinement layers. The first semiconductor layer 121 and the second semiconductor layer 122 have different conductivity types, different electrical properties, different polarities or different dopants for providing electrons or holes. For example, the first semiconductor layer 121 is composed of n-type semiconductor and the second semiconductor layer 122 is composed of p-type semiconductor. The active region 123 is formed between the first semiconductor layer 121 and the second semiconductor layer 122. When being driven by a current, electrons and holes are combined in the active region 123 to convert electrical energy into optical energy for illumination. The wavelength of the light generated by the semiconductor stack 12 can be adjusted by changing the physical properties and chemical composition of one or more layers in the semiconductor stack 12. When the material of the semiconductor stack 12 includes AlInGaP, the semiconductor stack 12 emits red light having a wavelength between 570 nm and 780 nm or yellow light having a wavelength between 550 nm and 570 nm. When the material of the semiconductor stack 12 includes InGaN, the semiconductor stack 12 emits blue light or deep blue light having a wavelength between 380 nm and 490 nm or green light having a wavelength between 490 nm and 550 nm. When the material of the semiconductor stack 12 includes AlGaN, the semiconductor stack 12 emits UV light having a wavelength between 280 nm and 380 nm. The active region 123 can be a single hetero-structure (SH), a double hetero-structure (DH), a double-side double hetero-structure (DDH), or a multi-quantum well (MQW) structure. The material of the active region 123 can be i-type, p-type or n-type semiconductor.

The semiconductor stack 12 further includes a buffer structure (not shown) between the first semiconductor layer 121 and the first surface 10a of the substrate 10. The buffer structure, the first semiconductor layer 121, the active region 123 and the second semiconductor layer 122 constitute the semiconductor stack 12. The buffer structure reduces the lattice mismatch and suppresses dislocation thereby improving the epitaxy quality. The material of the buffer structure includes GaN, AlGaN, or AlN. In an embodiment, the buffer structure includes a plurality of sub-layers (not shown) and the sub-layers include the same materials or different materials. In one embodiment, the buffer structure includes two sub-layers wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer can be higher or lower than the growth temperature of the third sub-layer. In an embodiment, the first, second, and third sub-layers include the same material, such as AlN; or different material, such as GaN and AlGaN.

An electrode is formed on the semiconductor mesas, including a first electrode 201 formed on the first mesa M1 and a plurality of second electrode 301 respectively formed on each of the second mesas M2. As shown in FIG. 1B, the first electrode 201 covers the upper surface and the sidewalls of the first mesa M1 and extends to the first surface 121a of the first semiconductor layer 121 to contact the first surface 121a and electrically connect the first semiconductor layer 121. The second electrodes 301 are respectively electrically connected to the second semiconductor layers 122 of the plurality of second mesas M2. In one embodiment, in order to have a sufficient contact area between the first electrode 201 and the first semiconductor layer 121, a distance d between the edge of the first electrode 201 and the edge of the first mesa M1 is greater than 0.05 μm. In one embodiment, in order to reduce an occupied area of the non-display area R1 to the light-emitting device 1, the distance d between the edge of the first electrode 201 and the edge of the first high mesa M1 is less than 10 μm. In one embodiment, the distance d is between 0.1-5 μm. The materials of the first electrode 201 and the second electrode 301 include metal, transparent conductive materials, or a combination thereof. Each of the first electrode 201 and the second electrode 301 can a single layer or multiple layers. The metal material includes Cr, Ti, W, Au, Ag, Al, In, Sn, Ni, Rh, Pt, an alloy or a laminated stack of the above materials. In addition, the transparent conductive material is transparent to the light emitted from the active region 123, and includes graphene, indium tin oxide (ITO), aluminum zinc oxide (AZO), gallium zinc oxide (GZO), zinc oxide (ZnO) or indium zinc oxide (IZO).

In another embodiment, subject to the metal material selected for the first electrode 201 and the second electrode 301, the light-emitting device 1 can further include a transparent conductive layer (not shown) between the second electrode 301 and the second semiconductor layer 122 on the second mesa M2. The transparent conductive layer is electrically connected to the second semiconductor layer 122 to reduce the contact resistance. The transparent conductive layer can be a metal or a transparent conductive material, wherein the metal can be a thin metal layer with high transmittance and the transparent conductive material is transparent to the light emitted from the active region 123, including graphene, ITO, AZO, GZO, ZnO or IZO.

In one embodiment, the first electrode 201 and/or the second electrode 301 may include a reflective structure, and the reflective structure has a reflectivity of more than 80% for the light emitted by the light emitting unit 22. In one embodiment, the reflection structure includes a metal reflection layer, or an omni-directional reflection structure (omni-directional reflector, ODR) composed of a transparent conductive layer and a metal reflection layer. In another embodiment (not shown), the reflective structure includes an omnidirectional reflective structure composed of a transparent insulating layer and a metal reflective layer. The transparent insulating layer of the first electrode 201 covers the top surface and sidewalls of the first mesa M1, exposing the first surface 121a, and the metal reflective layer covers the transparent insulating layer and the first surface 121a around the first mesa M1 to form the omnidirectional reflective structure. The transparent insulating layer of the second electrode 301 covers the top surface of the second mesa M2 and includes one or more openings. The metal reflective layer covers the transparent insulating layer and electrically contacts the second semiconductor layer 122 through the openings to form the omnidirectional reflective structure. The material of the transparent insulating layer includes $SiO_x$, $SiN_x$, $SiO_xN_y$, $Nb_2O_5$, $HfO_2$, $TiO_x$, $MgF_2$, $Al_2O_3$, etc.

A protective layer 50 covers the first mesa M1, the plurality of second mesas M2, the first electrode 201, the second electrodes 301, and the first surface 121a. The protective layer 50 includes a first opening 501 exposing the first electrode 201 and a plurality of second openings 502 respectively exposing the second electrodes 301. The material of the protective layer 50 can be a non-conductive material, including organic material or inorganic material. The organic material includes Su8, BCB, perfluorocyclobutane (PFCB), epoxy, acrylic resin, cyclic olefin copolymer (COC), PMMA, PET, PC, PI or fluorocarbon polymer. The inorganic material includes silicone, glass or dielectric material such as $SiO_x$, $SiN_x$, $SiO_xN_y$, $Nb_2O_5$, $HfO_2$, $TiO_x$, $MgF_2$, or $Al_2O_3$. In one embodiment, the protective layer 50 includes one pair or multiple pairs of layers with different refractive indexes alternately stacked. By selecting materials with different refractive indexes and the thicknesses thereof, the protective layer 50 can be a reflective structure which reflects light in a specified wavelength range. In one embodiment, the protective layer 50 includes a distributed Bragg reflector (DBR). In another embodiment, the protective layer 50 includes a dense layer (not shown) directly covering the surfaces of the second mesa M2 in the semiconductor stack 12. In one embodiment, the dense layer can be formed by atomic layer deposition. The material of the dense layer includes silicon oxide, aluminum oxide, hafnium oxide, tantalum oxide, zirconium oxide, yttrium oxide, lanthanum oxide, silicon nitride, aluminum nitride, or silicon oxynitride. In one embodiment, the interface between the dense layer and the semiconductor stack 12 includes metal elements and oxygen, where the metal elements include aluminum, hafnium, tantalum, zirconium, yttrium, or lanthanum. The dense layer has a thickness in a range between 30 Å and 2000 Å. In one embodiment, the dense layer has a thickness in a range between 100 Å and 1500 Å. In one embodiment, the dense layer can be conformably formed on the semiconductor stack 12. Due to the film quality of the dense layer, the dense layer can protect the semiconductor stack 12, such as preventing moisture from entering the semiconductor stack 12, and can increase the adhesion between the protective layer 50 and the semiconductor stack 12.

A first electrode pad 20 is formed on the first mesa M1 and connects to the first electrode 201 through the first opening 501 of the protective layer 50. A plurality of second electrode pads 30 is respectively formed on the second mesa M2 and connects to the second electrodes 201 through the second openings 502 of the protective layer 50. The first electrode pad 20 and the second electrode pads 30 can attach the light-emitting device 1 to the external electronic components. The materials of the first electrode pad 20 and the second electrode pad 30 include metals, such as Cr, Ti, Au, Al, Cu, Sn, Ni, Rh, W, In, Pt, an alloy or a laminated stack of the above materials. The first electrode pad 20 and the second electrode pad 30 can be composed of a single layer or multiple layers. For example, the first electrode pad 20 and the second electrode pad 30 include Ti/Au, Ti/Pt/Au, Cr/Au, Cr/Pt/Au, Ni/Au, Ni/Pt/Au or Cr/Al/Cr/Ni/Au. The thicknesses of the first electrode pad 20 and the second electrode pads 30 are greater than the thicknesses of the electrodes 201 and 301. In one embodiment, in a top view, the first electrode pad 20 has the same shape as that of the first mesa M1, and the shape of each the second electrode pads 30 is corresponding to each of the plurality of second mesa M2. In one embodiment, the shape of the mesa is the same as or similar with the shape of the electrode pad, wherein the shape can be circles, polygon or irregular shape.

FIG. 5 shows a schematic cross-sectional view of a display device 1000 in accordance with an embodiment of the present application. As shown in FIG. 5, the display device 1000 includes the light-emitting device 1 and a driving backplane 100 coupled with the light-emitting device 1. The driving backplane 100 can drive the light-emitting device 1. The light-emitting device 1 shown in FIG. 5 does not include the substrate 10, but in another embodiment, the light-emitting device 1 can include the substrate 10. It should be noted that, in order to make the figure explicit, the light-emitting device 1 shown in FIG. 5 is a schematic illustration, and the detail of the light-emitting device 1 should be referred to FIGS. 1A, 1B and related descriptions.

The driving backplane 100 includes a base 90, a driving circuit (not shown) formed on and inside the base 90, a first driving electrode 80a and a second driving electrode 80b. The base 90 of the driving backplane 100 includes a flexible substrate or a rigid substrate. Materials of the flexible substrate include thin glass, metal foil, plastic, polyimide, and the like. Materials of the rigid substrate include glass, sapphire, silicon, and the like. The first driving electrode 80a and the second driving electrode 80b are electrically connected to the driving circuit, and the driving circuit can be a passive matrix (PM) addressing driving or an active matrix (AM) addressing driving. The driving circuit may include, but is not limited to, data lines, scan lines, power lines, and active components. The active component includes FET, CMOS, TFT, HEMT, etc. The first driving electrode 80a is coupled to the first electrode pad 20 by a bonding layer 40, and each of the second driving electrodes 80b is coupled to the corresponding second electrode pad 30 by the bonding layer 40. By this way, the driving circuit can control the light-emitting units 22 in the display area of the light-emitting device 1, and more specifically, the driving circuit can drive the light-emitting units 22 individually. Since the first semiconductor layer 121 under the first mesa M1 and the first semiconductor layer 121 under the plurality of second mesas M2 are integrated, the first electrode pad 20 and the first electrode 201 formed on the first mesa M1 can be regarded as a common first electrode for all the light-emitting units 22. While being turned on, the light-emitting units 22 generate light, which can serve as sub-pixels PXs of the display device, and the adjacent sub-pixels PXs form a pixel. The size and the arrangement of the sub-pixels PX depend on the size and spacing of the light-emitting unit 22 (or the second mesa M2). In one embodiment, in the top view, the second mesa M2 has a diagonal length of less than 30 μm. In one embodiment, the diagonal length of the second mesa M2 is between 1 and 20 μm. In one embodiment, the gap between two adjacent second mesas M2 is 1-30 μm. In another embodiment, the area of each second mesa M2 can be designated in accordance with the various application of the light-emitting device. For example, the area and the arrangement of the second mesa M2 can be designed in accordance with the colors to be presented by each sub-pixel PX.

The bonding layer 40 includes solder or eutectic alloy, and the material thereof can be selected from Au—Sn, Sn, Sn—Ag—Cn, Cu—Sn, In, Sn—Bi or other suitable metal materials. In one embodiment, an insulating material (not shown) is disposed between each sub-pixel PX, and the insulating material is formed in the gaps among the electrode pads of each sub-pixel PX, the driving electrode and the bonding layer 40. For improving the yield and reliability of the bonding between the light-emitting device 1 and the driving backplane 100, the thickness of the first electrode pad 20 is substantially the same as or approximates to that of the second electrode pads 30. In one embodiment, the difference between the thickness of the first electrode pad 20 and the thickness of the second electrode pad 30 is less than 10%. In addition, the first mesa M1 and the second mesa M2 have the same or similar height, and the electrode pads formed thereon have the same or similar thickness as well. As a result, the alignment of light-emitting device 1 and the driving backplane 100 can be precise and the bonding yield between the light-emitting device 1 and the driving backplane 100 is improved. In one embodiment, the gap between adjacent second electrode pads 30 is 2-20 μm. In one embodiment, the shortest distance between the first electrode pad 20 and the second electrode pad 30 is 5-150 μm. In one embodiment, the shortest distance between the first electrode pad 20 and the second electrode pad 30 is 5-20 μm.

In an embodiment of the present application shown in FIG. 5, the display device 1000 can further include a wavelength modulation layer 60 on one side of the light-emitting device 1. More specifically, the wavelength modulation layer 60 is located on light-emitting surface of the light-emitting unit 22 (the second mesa M2) and forms a part of the sub-pixel PX. The wavelength modulation layer 60 includes color filter, multilayered filter, glue or sheet composed of phosphor material, a layer composed of quantum dot material, and the like. In one embodiment, the wavelength modulation layer 60 can convert the light emitted by the light-emitting units 22 into different colors. For example, the wavelength modulation layer 60A is a red wavelength conversion layer, the wavelength modulation layer 60B is a green wavelength conversion layer, and the wavelength modulation layer 60C is a blue wavelength conversion layer or a transparent layer, thereby realizing a full-color display device. In another embodiment, the wavelength modulation layer 60 can purify the color light emitted by the light-emitting device 1, so as to realize a wide color gamut display device. In another embodiment, the wavelength modulation layer 60 can include multiple modulation structures with different functions, such as modulation structures with both wavelength conversion and color purification. In another embodiment of the present application, the display device 1000 may include an opaque layer 70 between each sub-pixel PX, for example, between each wavelength modulation layer 60 or between light-emitting surfaces of each light-emitting unit 22. In a top view, the opaque layer 70 and the second mesa M2 are arranged alternately. The opaque layer 70 can be a black matrix. The material of the opaque layer 70 includes metal, metal oxide, photoresist, resin, glass powder paste, etc. The opaque layer 70 can block or absorb the light between adjacent light-emitting units 22, preventing light leakage or preventing the color interference between adjacent light-emitting units 22, thereby improving the color contrast of the display device 1000.

In another embodiment (not shown) of the present application, the light-emitting device 1 in the display device 1000 includes the substrate 10, and the wavelength modulation layer 60 and/or the opaque layer 70 are located on the light-emitting surface of the light-emitting device 1, that is, on the surface of the substrate 10 opposite the semiconductor stack 12.

Figure 2A:
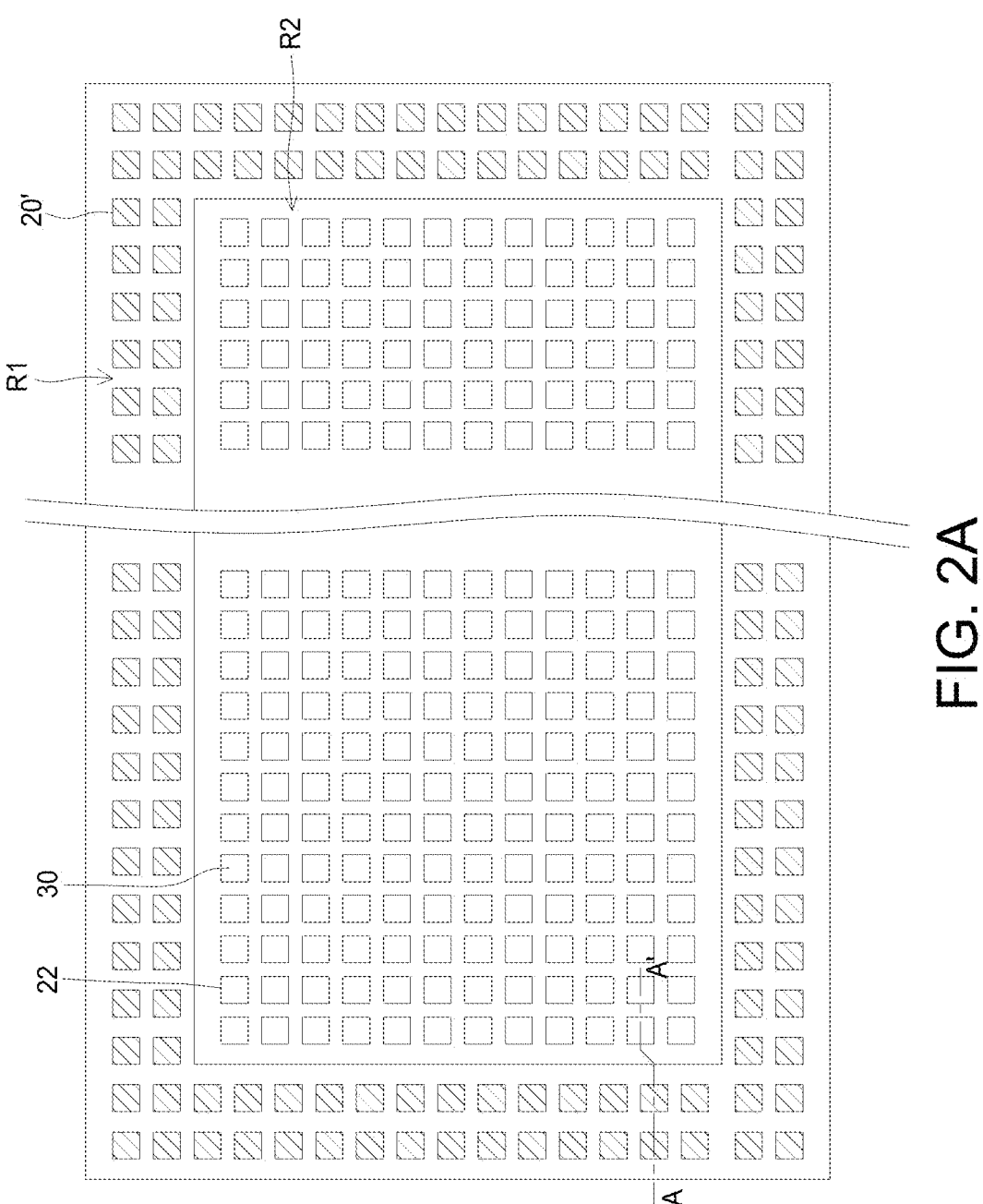
FIG. 2A shows a top view of a light-emitting device 2 in accordance with a second embodiment of the present application.
Figure 2B:
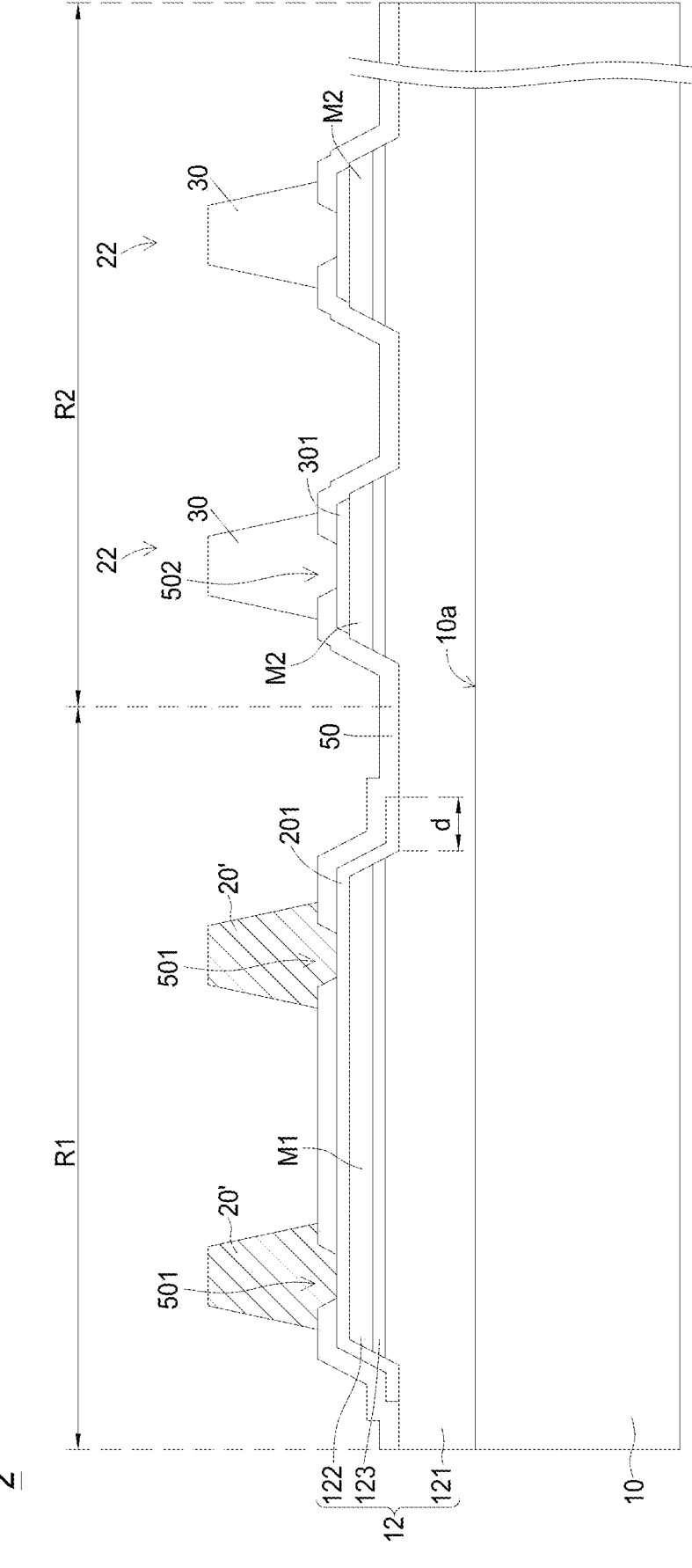
FIG. 2B shows a cross-sectional view taken along an AA' line in FIG. 2A.

FIG. 2A shows a top view of a light-emitting device 2 in accordance with a second embodiment of the present application. FIG. 2B shows a cross-sectional view taken along the AA' line in FIG. 2A. The difference between the light-emitting device 2 and the light-emitting device 1 is that the protective layer 50 of the light-emitting device 2 includes a plurality of first openings 501 located on the first mesa M1 and a plurality of first sub-electrode pads 20' arranged on the first mesa M1. The first sub-electrode pad 20' is connected to the first electrode 201 through the first opening 501. The material of the first sub-electrode pad 20' is the same as that of the first electrode pad 20, and the details thereof are not repeated here. In a top view, the first sub-electrode pad 20' has a first area and a first shape, and the second electrode pad 30 has a second area and a second shape. In one embodiment, the first area is the same as or approximates to the second area, and/or the first shape is similar to or the same as the second shape. The first area approximate to the second area means that the difference between the two areas is less than 20%. The first shape and the second shape can be circles, polygons, irregular shapes, and the like. The similar shapes mean that, for example, circles with different diameters, polygons with different lengths of the sides, and the like. In one embodiment, the distance between the adjacent first sub-electrode pads 20' is the same as or approximates to the distance between the adjacent second electrode pads 30. In one embodiment, the difference between the two distances mentioned above is less than 20%. Like the first embodiment, the thickness of first sub-electrode pad 20' is substantially the same as or approximates to that of the second electrode pad 30. In one embodiment, the difference between the thickness of the first sub-electrode pad 20' and the thickness of the second electrode pad 30 is less than 10%.

Figure 2C:
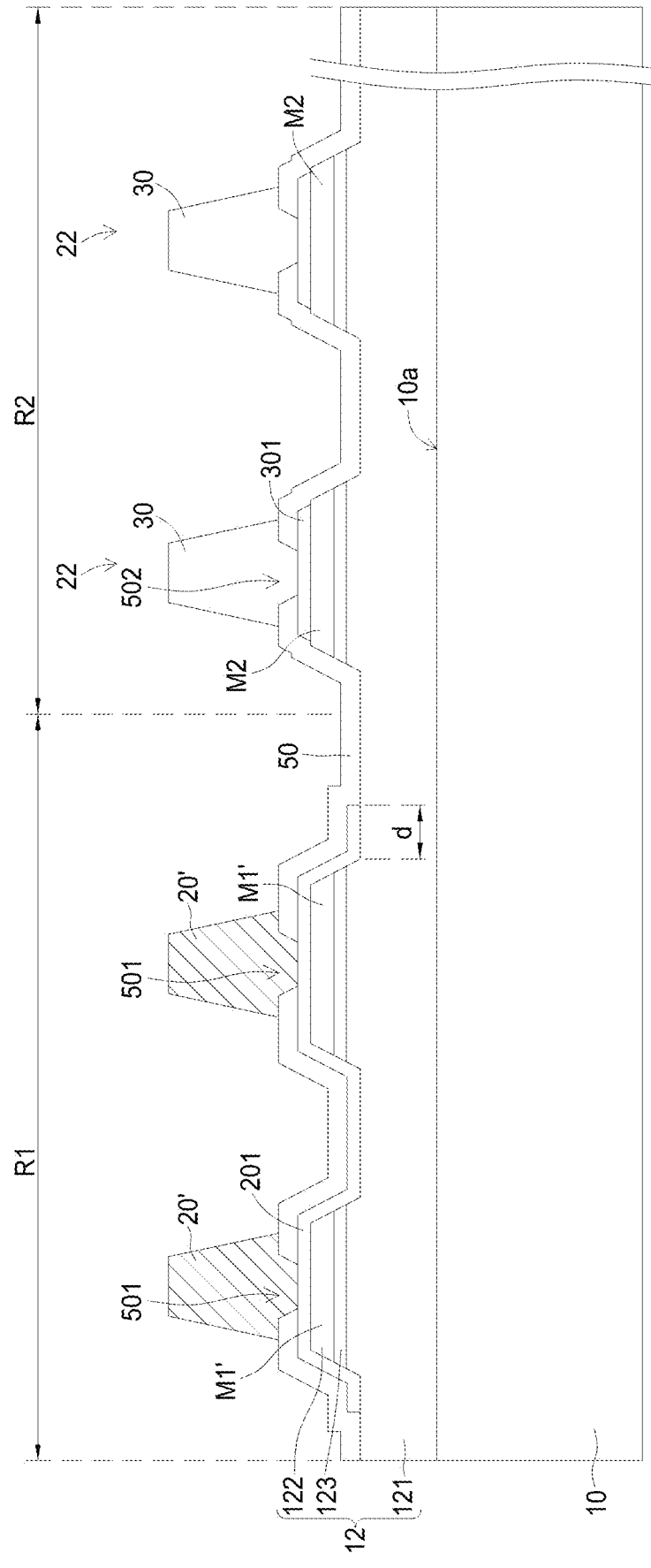
FIG. 2C shows a light-emitting device 3 in accordance with a third embodiment of the present application.

FIG. 2C shows a light-emitting device 3 in accordance with a third embodiment of the present application. The light-emitting device 3 shown in FIG. 2C is similar to the light-emitting device 2 shown in FIG. 2B. The difference between the two is that the semiconductor stack 12 of the light-emitting device 3 includes a plurality of first sub-mesas M1' formed in the non-display area R1, and the first electrode 201 continuously covers the upper surfaces and sidewalls of the plurality of first sub-mesas M1' and extends to the first surface 121a of to contact the first semiconductor layer 121, so as to be electrically connected to the first semiconductor layer 121. The first sub-mesa M1' and the second mesa M2 substantially have the same height. In addition, the protective layer 50 includes a plurality of first openings 501 respectively located on the plurality of first sub-mesas M1'. The first sub-electrode pads 20' are correspondingly disposed on each of the first sub-mesas M1' and connected to the first electrode 201 through the plurality of first openings 501. In one embodiment, in a top view, the area of the first sub-mesa M1' is the same as or approximates to that of and the second mesa M2. The first sub-mesa M1' and the second mesa M2 have the same or similar shapes. In one embodiment, the difference between the areas of the first sub-mesa M1' and the second mesa M2 is less than 20%. The details of the first sub-electrode pads 20' of the light-emitting device 3, such as the spacing, thickness, area and shape, are the same as the description of the light-emitting device 2, and are not repeated here.

FIG. 6 shows a schematic cross-sectional view of a display device 2000 which includes the light-emitting device 2 or 3 in accordance with some embodiments of the present application. As shown in FIG. 6, the display device 2000 includes the driving backplane 100 and the light-emitting device 2 bonded thereon. It should be noted that, in order to make the figure clear, the light-emitting device 2 or 3 in FIG. 6 is schematically shown, and the detail of the light-emitting device 2 or 3 should be referred to FIG. 2A to 2C and related descriptions. The first sub-electrode pads 20' of the light-emitting device 2 are bonded to the first driving electrode 80a on the driving backplane 100 through the bonding layer 40, and each of the second electrode pads 30b of the light-emitting device 2 is bonded to the second driving electrode 80a on the driving backplane 100 through the bonding layer 40. Since the first sub-electrode pad 20' and the second electrode pad 30 of the light-emitting device 2 have the same or near areas, the volume, area or thickness of the metal bonding layers 40 disposed on each first sub-electrode pad 20' and each second electrode pad 30 can be controlled to be consistent or similar, so as to avoid an overflow of the bonding layer 40 during bonding process. Therefore, the bonding states between the driving backplane 100 and both the non-display area R1 and the display area R2 can be controlled to be consistent, thereby improving the yield and reliability of the display device 2000. Similarly, in another embodiment that the display device 2000 includes the light-emitting device 3 having the plurality of first sub-electrode pads 20' bonded to the driving backplane 100, and the same effect can also be achieved.

Figure 3A:
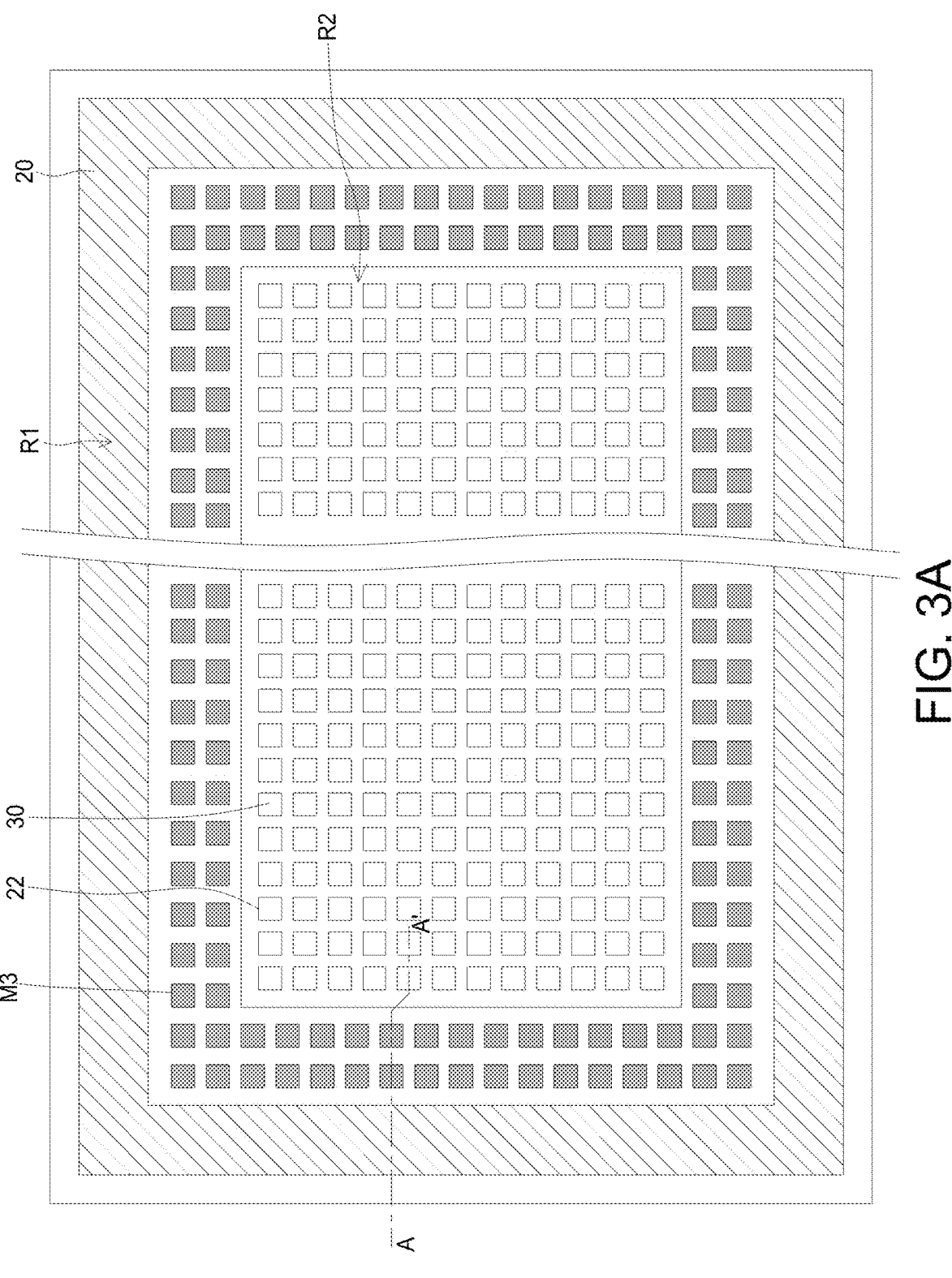
FIG. 3A shows a top view of a light-emitting device 4 in accordance with a fourth embodiment of the present application.
Figure 3B:
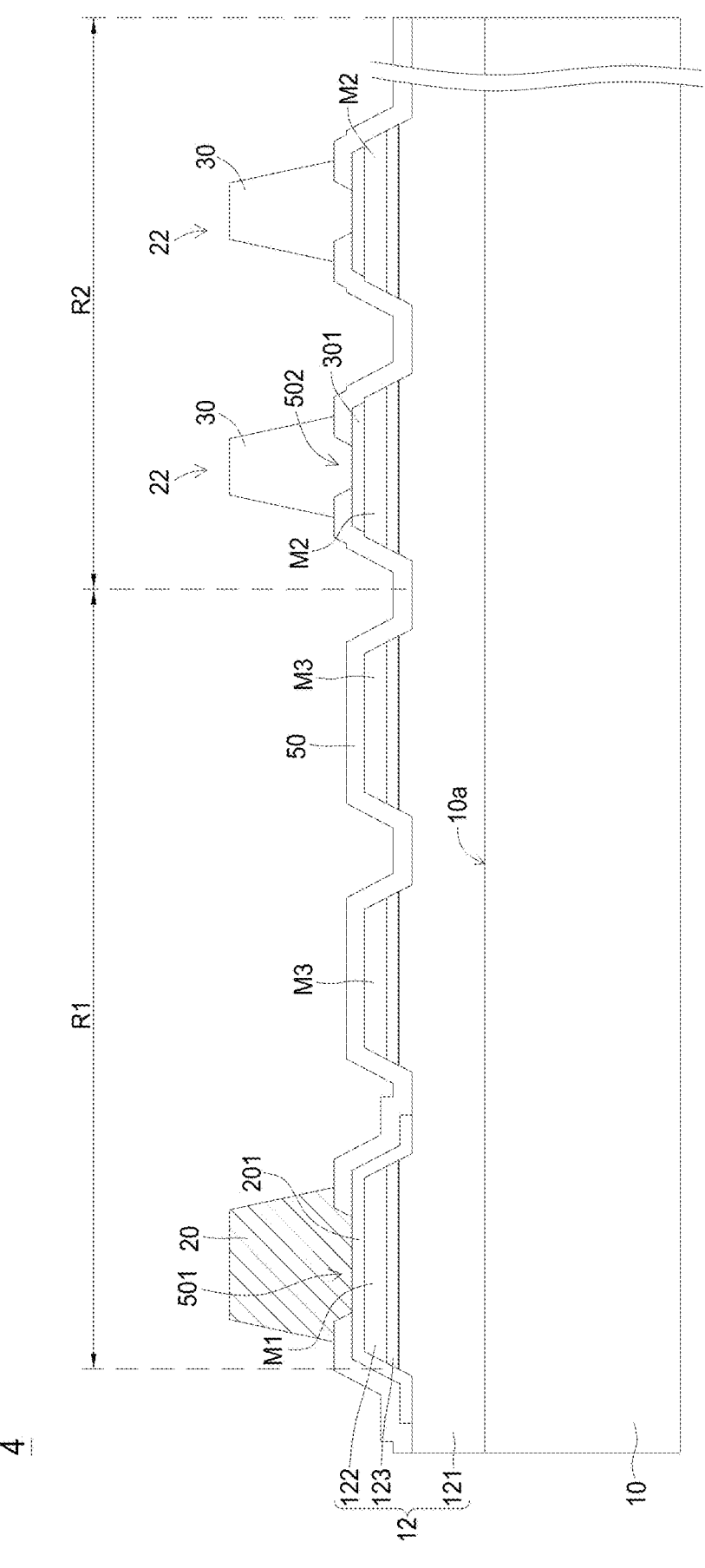
FIG. 3B shows a cross-sectional view taken along an AA' line in FIG. 3A.
Figure 4:
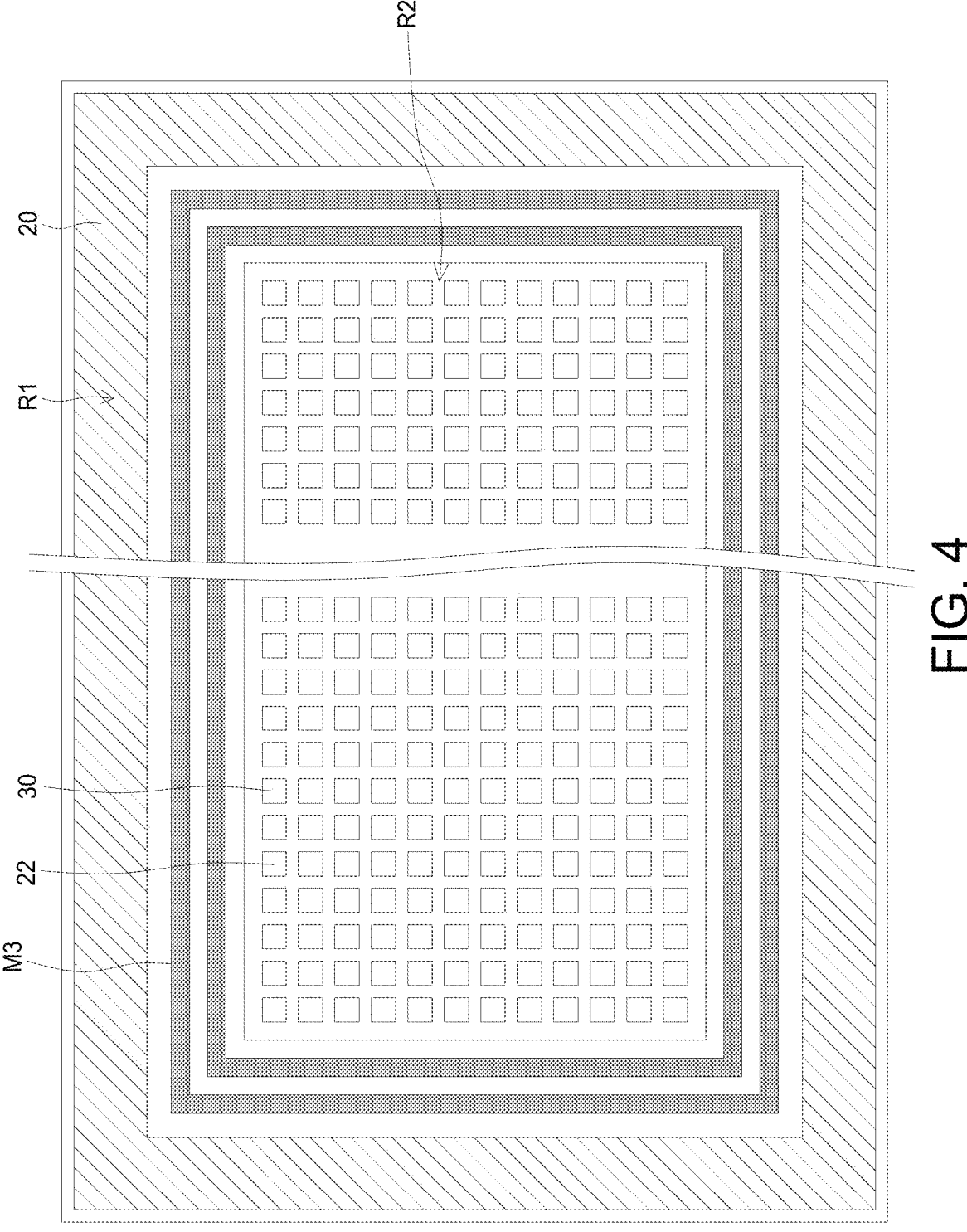
FIG. 4 shows a light-emitting device 4 in accordance with another embodiment of the present application.

FIG. 3A shows a top view of a light-emitting device 4 in accordance with a fourth embodiment of the present application and FIG. 3B shows a cross-sectional view taken along the AA' line in FIG. 3A. The difference between the light-emitting device 4 and the light-emitting device 1 is that in the non-display area R1, a third mesa M3 is formed between the first mesa M1 and the second mesa M2 and between the first electrode pad 20 and the second electrode pad 30. The third mesa M3 is separated from the first mesa M1 and the second mesa M2 and is electrically insulated from the first electrode pad 20 and the second electrode pad 30. Like the first and second mesas M1 and M2, the third mesa M3 includes the active region 123 and the second semiconductor layer 122 stacked on the first semiconductor layer 121. The third mesa M3, the first mesa M1 and the second mesa M2 can have the same heights or different heights. In another embodiment (not shown in the figures), the sidewall of the third mesa M3 may include a stepped shape in a cross-sectional view. In one embodiment, the third mesa M3 does not overlap with the first electrode pad 20 and/or the second electrode pad 30 in the thickness direction. In one embodiment, the protective layer 50 further covers the third mesa M3. The number of the third mesa M3 can be single or multiple, and the shape of the third mesa M3 in the top view cab be circle, strip, polygon, irregular shape, etc. In one embodiment, the plurality of third mesa M3 can be arranged regularly or irregularly. For example, as shown in FIG. 3A, single third mesa M3 is in the shape of a polygon, and the plurality of the third mesas M3 form a regularly arranged pattern. In another embodiment shown in FIG. 4, the third mesa M3 may include a plurality of separated strip patterns, or one or more annular-shaped third mesa M3 composed of connected strip patterns. In one embodiment that the non-display area R1 is arranged to surround the display area R2 as shown in FIG. 3A, the third mesa M3 may also surround the plurality of second mesas M2 correspondingly. However, the arrangement of the third mesa M3 is not limited to the above embodiments, and the third mesa M3 can be designed in accordance with the arrangement of the non-display area R1 and the display area R2 of the light-emitting device and/or the first mesas M1 and the second mesas M2.

In some cases when bonding light-emitting device and driving the backplane, the bonding layer 40 may overflow to areas other than the first electrode pad 20 and the second electrode pad 30. For example, the bonding layer 40 which is used to bond the first electrode pad 20 and the first driving electrode 80a may overflow to the display area R2, and may even contact the second electrode pad 30 or the second driving electrode 80b to cause a short circuit. As a result, the light-emitting device and the display device fail. In the present embodiment, the light-emitting device 4 includes the third mesa M3 located between the first mesa M1 and the second mesa M2 and between the first electrode pad 20 and the second electrode pad 30. Even if the bonding layer 40 overflows during the bonding process, the third mesa M3 can block the overflow to contact the electrode pads with different electrical properties, so as to prevent the light-emitting device 4 from failing.

It will be apparent to those having ordinary skill in the art that various modifications and variations can be made to the devices in accordance with the present disclosure without departing from the scope or spirit of the disclosure. For example, the light-emitting device in accordance with some embodiments may include the plurality of first sub-electrode pads 20' like the light-emitting device 2 and the third mesa M3 such like the light-emitting device 3. For example, the light-emitting devices 2, 3 and 4 may or may not include the substrate 10.

In view of the foregoing, it is intended that the present disclosure covers modifications and variations of this disclosure provided they fall within the scope of the following claims and their equivalents.

What is claimed is:

1. A light-emitting device, comprising:
a semiconductor stack, comprising:
 a first semiconductor layer, having a first conductivity type;
 a first mesa, formed on the first semiconductor layer; and
 a plurality of second mesas, spaced apart from each other and formed on the first semiconductor layer and separated from the first mesa;
wherein the first mesa and the plurality of second mesas respectively include a second semiconductor layer on the first semiconductor layer, and the second semiconductor layers have a second conductivity type different from the first conductivity type;
a first electrode, covering and contacting the first mesa and electrically connected to the first semiconductor layer;
a first electrode pad, formed on the first mesa and connected to the first electrode;
a plurality of second electrode pads, correspondingly formed on the plurality of second mesas, and each of the plurality of second electrode pads being electrically connected to the second semiconductor layer of each of the plurality of second mesas;
a plurality of second electrodes, correspondingly formed between the plurality of second mesas and the plurality of second electrode pads; and a protective layer on the first electrode and the second electrodes, comprising:
 a first opening formed on the first electrode, wherein the first electrode pad fills in the first opening and connects to the first electrode; and
 a plurality of second openings correspondingly formed on the plurality of second electrode, wherein the plurality of second electrode pads correspondingly fills in the plurality of second openings and connects to the plurality of second electrodes;
wherein, each of the plurality of second electrode pads is physically separated from each other.

2. The light-emitting device according to claim 1, wherein the first electrode pad comprises a plurality of first sub-electrode pads separately formed on the first mesa.

3. The light-emitting device according to claim 2, wherein the first mesa comprises a plurality of first sub-mesas and the plurality of first sub-electrode pads is correspondingly formed on the plurality of first sub-mesas.

4. The light-emitting device according to claim 3, wherein the first electrode continuously covers and contacts the plurality of first sub-mesas.

5. The light-emitting device according to claim 2, wherein in a top view, one of the plurality of first sub-electrode pads comprises a first area and a first shape, and one of the plurality of second electrode pads comprises a second area and a second shape; and
 a difference between the first area and the second area is less than 20%, and/or the first shape and the second shape are the same or similar.

6. The light-emitting device according to claim 1, wherein the semiconductor stack further comprises one or a plurality of third mesas formed on the first semiconductor layer and separated from the first mesa and the plurality of second mesas;
 wherein in a top view, the one or the plurality of third mesas is formed between the first mesa and the plurality of second mesas and are electrically insulated from both the first electrode pad and the plurality of second electrode pads.

7. The light-emitting device according to claim 6, wherein in the top view, the one or the plurality of third mesas surrounds the plurality of second mesas.

8. The light-emitting device according to claim 6, wherein the protective layer further covers the one or the plurality of third mesas.

9. The light-emitting device according to claim 1, wherein a distance between an edge of the first electrode and an edge of the first mesa is between 0.1-5 μm.

10. The light-emitting device according to claim 1, wherein the protective layer comprises distributed Bragg reflector.

11. The light-emitting device according to claim 1, wherein a shortest distance between the first electrode pad and the second electrode pad is 5-150 μm, and a difference between thicknesses of the first electrode pad and the second electrode pad is less than 10%.

12. The light-emitting device according to claim 1, wherein a gap between two adjacent second mesas is 1-30 μm.

13. The light-emitting device according to claim 1, wherein in the top view, each of the plurality of second mesas comprises a diagonal length of less than 30 μm.

14. A display device, comprising:
a driving backplane, comprising a first driving electrode and a plurality of second driving electrodes;

a light-emitting device according to claim 1, coupled to the driving backplane; and a bonding layer, connecting the first electrode pad and the first driving electrode, and correspondingly connecting each of the plurality of second electrode pads and each of the plurality of second driving electrodes.

15. The display device according to claim 14, further comprising a wavelength modulation layer and an opaque layer formed on a light-emitting surface of the light-emitting device; wherein in a top view, the opaque layer and the plurality of second semiconductor mesas are arranged alternately.

16. A light-emitting device, comprising:

a semiconductor stack, comprising:

a first semiconductor layer, having a first conductivity type;

a first mesa, formed on the first semiconductor layer; and a plurality of second mesas, spaced apart from each other and formed on the first semiconductor layer and separated from the first mesa;

wherein the first mesa and the plurality of second mesas respectively include a second semiconductor layer on the first semiconductor layer, and the second semiconductor layers have a second conductivity type different from the first conductivity type;

a first electrode, covering and contacting the first mesa and electrically connected to the first semiconductor layer;

a first electrode pad, formed on the first mesa and connected to the first electrode;

a plurality of second electrode pads, correspondingly formed on the plurality of second mesas, and each of the plurality of second electrode pads being electrically connected to the second semiconductor layer of each of the plurality of second mesas;

a plurality of second electrodes, correspondingly formed between the plurality of second mesas and the plurality of second electrode pads; and a protective layer on the first electrode and the second electrodes, comprising:

a first opening formed on the first electrode, wherein the first electrode pad fills in the first opening and connects to the first electrode; and a plurality of second openings correspondingly formed on the plurality of second electrode, wherein the plurality of second electrode pads correspondingly fills in the plurality of second openings and connects to the plurality of second electrodes;

wherein, each of the plurality of second electrode pads is driven individually.

17. A display device, comprising:

a driving backplane, comprising a first driving electrode and a plurality of second driving electrodes;

a light-emitting device according to claim 16, coupled to the driving backplane; and a bonding layer, connecting the first electrode pad and the first driving electrode, and correspondingly connecting each of the plurality of second electrode pads and each of the plurality of second driving electrodes.

18. The light-emitting device according to claim 1, wherein the first electrode pad has a width smaller than that of the first mesa.

19. The light-emitting device according to claim 1, wherein a first distance is between two adjacent ones of the plurality of second mesas, a second distance is between the first mesa and one of the plurality of second mesas closest to the first mesa, and the first distance is smaller than the second distance.

* * * * *